United States Patent
Stan et al.

(10) Patent No.: US 8,003,571 B2
(45) Date of Patent: *Aug. 23, 2011

(54) BUFFER LAYERS FOR COATED CONDUCTORS

(75) Inventors: Liliana Stan, Los Alamos, NM (US); Quanxi Jia, Los Alamos, NM (US); Stephen R. Foltyn, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 732 days.

This patent is subject to a terminal disclaimer.

(21) Appl. No.: 11/890,812

(22) Filed: Aug. 7, 2007

(65) Prior Publication Data

US 2008/0234134 A1    Sep. 25, 2008

Related U.S. Application Data

(63) Continuation-in-part of application No. 11/486,731, filed on Jul. 13, 2006, now Pat. No. 7,737,085.

(60) Provisional application No. 60/699,241, filed on Jul. 13, 2005.

(51) Int. Cl.
*H01B 12/00* (2006.01)
*H01L 39/00* (2006.01)
*H01L 31/00* (2006.01)

(52) U.S. Cl. ........ 505/237; 505/238; 505/191; 505/701; 428/701; 428/702

(58) Field of Classification Search .......... 505/230–239; 428/699–701
See application file for complete search history.

(56) References Cited

U.S. PATENT DOCUMENTS

| | | |
|---|---|---|
| 6,190,752 B1 | 2/2001 | Do et al. |
| 6,270,908 B1 | 8/2001 | Williams et al. |
| 6,743,533 B1 | 6/2004 | Kakimoto et al. |
| 6,756,139 B2 | 6/2004 | Jia et al. |
| 6,933,065 B2 | 8/2005 | Arendt et al. |
| 2002/0082171 A1* | 6/2002 | Schoop et al. ............... 505/100 |
| 2003/0036483 A1* | 2/2003 | Arendt et al. ............... 505/239 |
| 2004/0265649 A1 | 12/2004 | Selvamanickam et al. |
| 2005/0159298 A1* | 7/2005 | Rupich et al. ............... 502/100 |
| 2005/0239659 A1* | 10/2005 | Xiong et al. ............... 505/300 |
| 2006/0115580 A1 | 6/2006 | Selvamanickam et al. |
| 2007/0012975 A1 | 1/2007 | Arendt et al. |

OTHER PUBLICATIONS

Muenchausen et al, "Effects of Beam Parameters on Excimer Laser Deposition of $YBa_2Cu_3O_{7-\delta}$", Appl. Phys. Lett. 56, 578 (1990).

* cited by examiner

*Primary Examiner* — Stanley Silverman
*Assistant Examiner* — Kallambella Vijayakumar
(74) *Attorney, Agent, or Firm* — Holly L. Teeter; Juliet A. Jones; Bruce H. Cottrell

(57) ABSTRACT

A composite structure is provided including a base substrate, an IBAD oriented material upon the base substrate, and a cubic metal oxide material selected from the group consisting of rare earth zirconates and rare earth hafnates upon the IBAD oriented material. Additionally, an article is provided including a base substrate, an IBAD oriented material upon the base substrate, a cubic metal oxide material selected from the group consisting of rare earth zirconates and rare earth hafnates upon the IBAD oriented material, and a thick film upon the cubic metal oxide material. Finally, a superconducting article is provided including a base substrate, an IBAD oriented material upon the base substrate, a cubic metal oxide material selected from the group consisting of rare earth zirconates and rare earth hafnates upon the IBAD oriented material, and an yttrium barium copper oxide material upon the cubic metal oxide material.

14 Claims, 8 Drawing Sheets

Fig. 8(a) (top) and Fig. 8(b) (bottom)

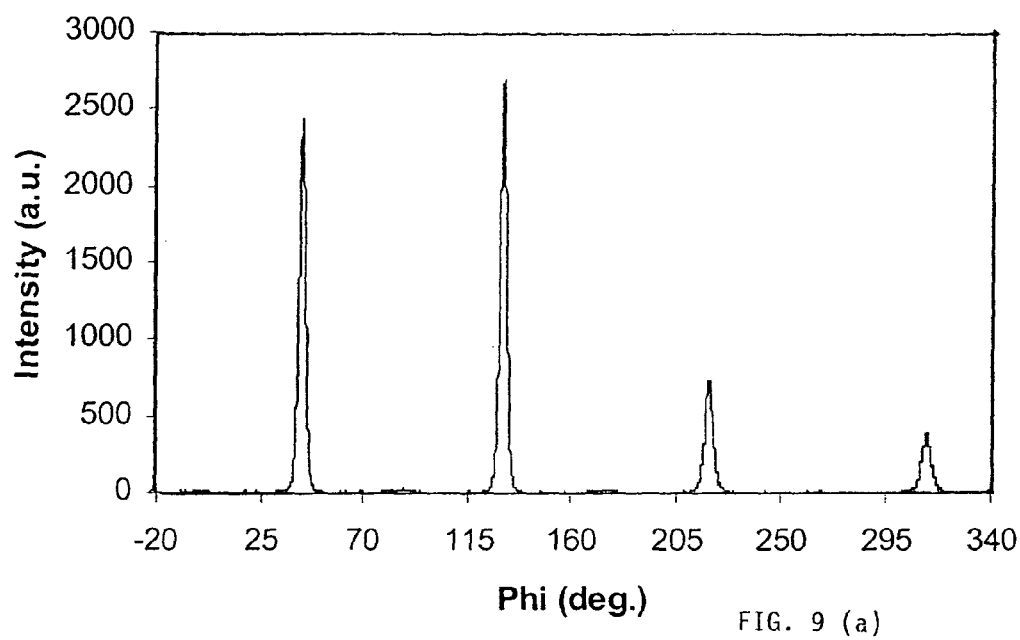
FIG. 9 (a)
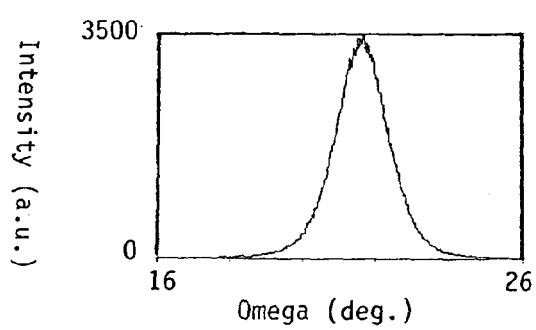
FIG. 9(a) inset

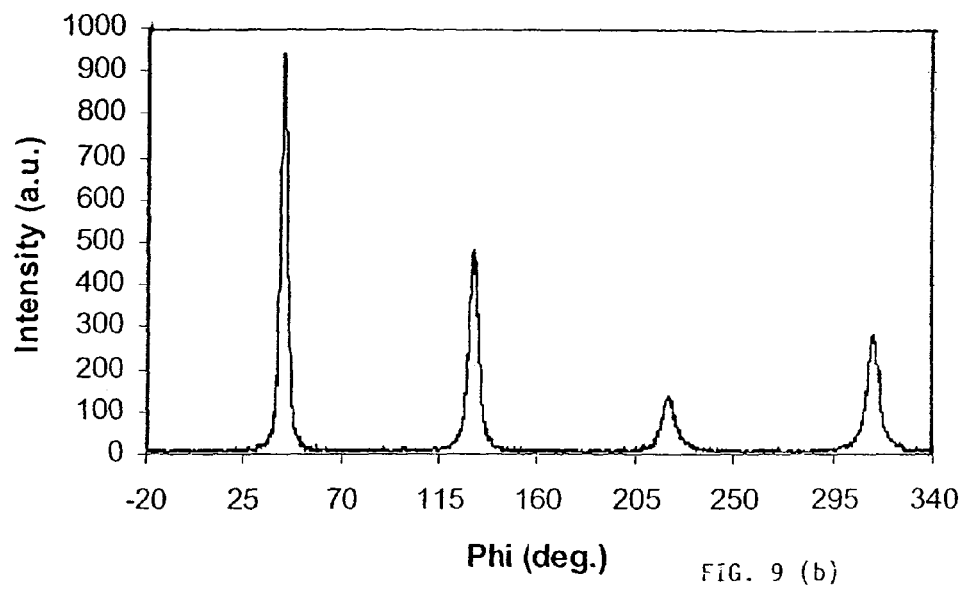
FIG. 9(b)
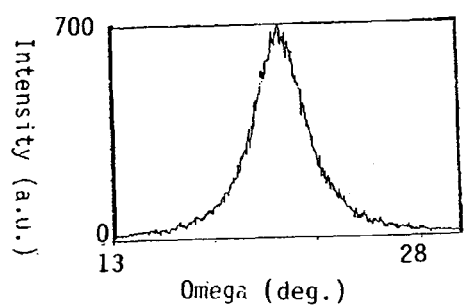
FIG. 9(b) inset

BUFFER LAYERS FOR COATED CONDUCTORS

RELATED APPLICATIONS

This application is a continuation-in-part of application Ser. No. 11/486,731, filed Jul. 13, 2006, now U.S. Pat. No. 7,737,085 which claims the benefit of U.S. Provisional Application No. 60/699,241, filed Jul. 13, 2005.

STATEMENT REGARDING FEDERAL RIGHTS

The United States government has rights in this invention pursuant to Contract No. DE-AC52-06NA25396 between the United States Department of Energy and Los Alamos National Security, LLC for the operation of Los Alamos National Laboratory.

FIELD OF THE INVENTION

The present invention relates to a composite structure suitable for subsequent deposition of a thick film.

BACKGROUND OF THE INVENTION

The preparation of composite structures suitable for subsequent deposition of a thick film is critical to a number of technical areas. For example, composite structures with a thick film include ferroelectric structures, photovoltaic structures, and superconducting structures. If the ultimate structure is used as a ferroelectric or photovoltaic structure, then the thick film may be a conductive oxide, ferroelectric material, a ferromagnetic material, a piezoelectric material, an insulating material, or a semiconductive material. If the ultimate structure is used as a superconducting structure, then the thick film may be a high temperature superconductor ("HTS") (e.g., yttrium barium copper oxide ("YBCO")).

A composite structure coated with a HTS thick film is commonly referred to as a coated conductor. The standard architecture for the coated conductor's composite structure using an ion beam assisted deposition ("IBAD") template is either: (1) base substrate/aluminum oxide ("$Al_2O_3$")/yttrium oxide ("$Y_2O_3$")/IBAD-magnesium oxide ("MgO")/homoepitaxial-MgO/lanthanum manganate ("$LaMnO_3$") or strontium ruthenate ("$SrRuO_3$") or strontium titanate ("$SrTiO_3$") or mixtures of $SrRuO_3$ and $SrTiO_3$, or (2) base substrate/erbium oxide ("$Er_2O_3$")/IBAD-MgO/homoepitaxial-MgO/$LaMnO_3$ or $SrRuO_3$ or $SrTiO_3$ or mixtures of $SrRuO_3$ and $SrTiO_3$. The composite structure is then coated with a HTS thick film such as YBCO.

The $LaMnO_3$, $SrRuO_3$, $SrTiO_3$, and mixtures of $SrRuO_3$ and $SrTiO_3$ layer in the composite structure's standard architecture serves as a buffer material. Although these buffer materials result in coated conductors with high critical current densities ("$J_c$"), they are problematic for cost-effective, long-length coated conductor production. For example, each of these buffer materials require a homoepitaxial MgO layer on top of the IBAD MgO. The slow deposition rate of the homoepitaxial MgO layer affects the coated conductor's cost of production. Moreover, the difficult control of stoichiometry and the slow deposition rate make these buffer materials unpopular in industry.

SUMMARY OF THE INVENTION

The present invention overcomes many of these drawbacks and enables the end user to effectively produce a composite structure suitable for subsequent deposition of a thick film in a timely and economical fashion.

By way of example, and not of limitation, the present invention is a composite structure that is suitable for subsequent deposition of a thick film. The present invention replaces the homoepitaxial MgO and the $LaMnO_3$, $SrRuO_3$, $SrTiO_3$, or the mixture of $SrRuO_3$ and $SrTiO_3$ with a cubic metal oxide material. The cubic metal oxide material is selected from the group of rare earth zirconates and rare earth hafnates. Thus, one aspect of the present invention is a composite structure comprising a base substrate, an IBAD oriented material upon the base substrate, and a cubic metal oxide material selected from the group consisting of rare earth zirconates and rare earth hafnates upon the IBAD oriented material.

In another aspect of the present invention, the composite structure is coated with a thick film. Thus, one aspect of the present invention is an article comprising a base substrate, an IBAD oriented material upon the base substrate, a cubic metal oxide material selected from the group consisting of rare earth zirconates and rare earth hafnates upon the IBAD oriented material, and a thick film upon the cubic metal oxide material.

In another aspect of the present invention, the composite structure is coated with YBCO. Thus, one aspect of the present invention is a superconducting article comprising a base substrate, an IBAD oriented material upon the base substrate, a cubic metal oxide material selected from the group consisting of rare earth zirconates and rare earth hafnates upon the IBAD oriented material, and an YBCO material upon the cubic metal oxide material.

In the present invention the cubic metal oxide material selected from the group consisting of rare earth zirconates and rare earth hafnates and the thick film can be deposited by pulsed laser deposition ("PLD"), metalorganic chemical vapor deposition ("MOCVD"), evaporation (e.g., e-beam evaporation and activated reactive evaporation), sputtering (e.g., magnetron sputtering, ion beam sputtering, and ion assisted sputtering), cathodic arc deposition, chemical vapor deposition, plasma enhanced chemical vapor deposition, atomic layer deposition, molecular beam epitaxy, sol-gel processes, liquid phase epitaxy, and the like.

BRIEF DESCRIPTION OF THE DRAWINGS

The present invention will be more fully understood by reference to the following drawings which are for illustrative purposes only.

FIG. 9 shows the XRD φ scans around the [103] YBCO and the rocking curve of (005) YBCO (inset) for the (a) YBCO/samarium zirconate and (b) YBCO/$Sm_2O_3$.

DETAILED DESCRIPTION

Figure 1:
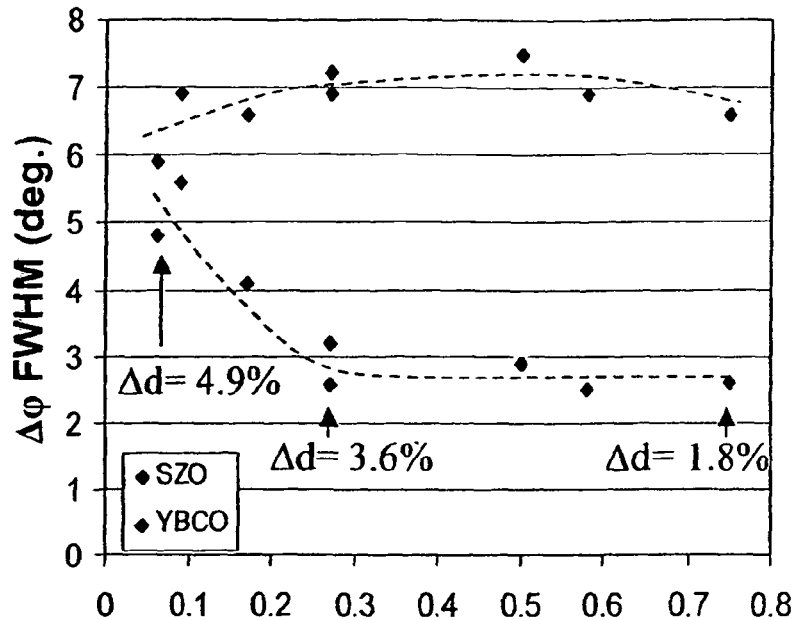
FIG. 1 shows in-plane full width half maximum ("FWHM") texture values for samarium zirconate and YBCO plotted versus samarium content in a samarium zirconate layer.

The present invention enables the end user to effectively produce a composite structure suitable for subsequent deposition of a thick film. It will be appreciated that each composite structure of the invention may vary as to configuration and specific step sequence without departing from the basic concepts as disclosed herein.

The present invention is a composite structure suitable for subsequent deposition of a thick film. As discussed above, the present invention is a composite structure that replaces the homoepitaxial MgO and the $LaMnO_3$, $SrRuO_3$, $SrTiO_3$, or the mixture of $SrRuO_3$ and $SrTiO_3$ with a cubic metal oxide material. The cubic metal oxide material is selected from the group of rare earth zirconates and rare earth hafnates. Thus, one aspect of the present invention is composite structure comprising a base substrate, an IBAD oriented material upon the base substrate, and a cubic metal oxide material upon the IBAD oriented material. In another aspect of the present invention, the composite structure is coated with a thick film. Thus, the present invention is also an article comprising a composite structure and a thick film upon the composite structure. In other words, the present invention is also an article comprising a base substrate, an IBAD oriented material upon the base substrate, a cubic metal oxide material upon the IBAD oriented material, and a thick film upon the cubic metal oxide material. In another aspect of the present invention, the composite structure is coated with an YBCO material. In other words, the present invention is also a superconducting article comprising a base substrate, an IBAD oriented material upon the base substrate, a cubic metal oxide material upon the IBAD oriented material, and an YBCO material upon the cubic metal oxide material.

The base substrate may comprise a polycrystalline metal (e.g., metal alloys including (1) nickel-based alloys such as various Hastelloy metals, Haynes metals, and Inconel metals, (2) iron-based metals such as steels and stainless steels, (3) copper-based metals such as copper-beryllium alloys, etc), a polycrystalline ceramic (e.g., polycrystalline aluminum oxide, polycrystalline yttria-stabilized zirconia ("YSZ"), forsterite, yttrium-iron-garnet ("YIG"), silica, etc), a single crystal (e.g., MgO, lanthanum aluminate, or aluminum oxide, etc), or an amorphous material (e.g., silica, metallic glass, glass, etc). The base substrate is determined by the composite structure's ultimate application. For example, if the composite structure is coated with a HTS thick film, then the base substrate may comprise a polycrystalline metal because polycrystalline metal is flexible and can be shaped into coils, motors, magnets and the like. Moreover, the base substrate may be polished to provide a smoother surface for subsequent layers.

An IBAD oriented material is upon the base substrate. The oriented material may comprise an oxide and have a cubic structure (e.g., cubic oxide with a rock-salt-like structure including MgO, calcium oxide, strontium oxide, zirconium oxide, barium oxide, europium oxide, samarium oxide, others described by U.S. Pat. No. 6,190,752 by Do et al, etc), fluorite structure (e.g., cerium oxide, etc), perovskite structure (e.g., strontium ruthenate, lanthanum magnate, etc), or orthorhombic structure (e.g., lanthanum aluminate, etc). Alternatively, the oriented material may comprise a nitride material (e.g., titanium nitride, etc).

It is to be understood that one or more structural layers can be placed between the base substrate and the IBAD oriented material. The structural layers may comprise a layer of an oxide or oxynitride material (e.g., yttrium oxide, aluminum oxynitride, etc) or an inert material (e.g., aluminum oxide, etc). Or, the oxide or oxynitride material may be upon the inert material (thereby forming a composite base substrate). Moreover, the layers can be amorphous or crystalline. The atoms of a "crystalline" material have order (i.e., definite pattern) over lengths longer than a few nanometers.

A cubic metal oxide material is upon the IBAD oriented material. The cubic metal oxide material is selected from the group consisting of rare earth zirconates and rare earth hafnates. It is to be understood that rare earth metals can form alloys with zirconium and hafnium. Therefore, the cubic metal oxide material may comprise samarium zirconate, samarium hafnate, dysprosium zirconate, dysprosium hafnate, gadolinium zirconate, gadolinium hafnate, neodymium zirconate, neodymium hafnate, erbium zirconate, erbium hafnate, ytterbium zirconate, or ytterbium hafnate.

Any composition of the cubic metal oxide material may be useful, but compositions with a rare earth metal content ranging from about 6 atomic percent to about 99 atomic percent can result in coated conductors with superconducting properties similar to those with $SrTiO_3$ buffer layers if a HTS thick film is subsequently deposited upon the composite structure. Moreover, for compositions with a rare earth metal content ranging from about 25 atomic percent to about 97 atomic percent the resulting coated conductors can have in-field performances even more closely comparable to $SrTiO_3$ buffer layers if a HTS thick film is subsequently deposited upon the composite structure.

Rare earth metals can form alloys with zirconium and hafnium and the alloys can exist in the cubic oxide form over a wide range of stoichiometries and compositions. For example, if the cubic metal oxide material is samarium zirconate, then its formula may be $Sm_XZr_{1-X}O_Y$. As discussed above, X can range from about 0.06 to about 0.99. The oxygen content (i.e., Y) varies with the samarium content and can be roughly calculated from the equation $Y=-0.5X+2$. Thus, samarium zirconate exists over a wide range of compositions.

The composite structure is suitable for subsequent deposition of a thick film. Thus, the present invention also includes an article comprising a composite structure and a thick film upon the composite structure (i.e., a base substrate, an IBAD oriented material upon the base substrate, a cubic metal oxide material upon the IBAD oriented material, and a thick film upon the cubic metal oxide material).

The thick film may comprise superconductor materials, semiconductor materials, photovoltaic materials, magnetic materials, ferroelectric materials, ferromagnetic materials, piezolelectirc materials, insulating materials, conductive materials, and precursor materials for superconductors. If the thick film is a HTS material, then it may comprise bismuth and thalium based superconductor materials or YBCO (e.g., $YBa_2Cu_3O_{7-\delta}$, $Y_2Ba_4Cu_7O_{14+x}$, or $YBa_2Cu_4O_8$, etc). If the thick film comprises YBCO, other rare earth metals can be substituted for some or all of the yttrium (e.g., a mixture of europium with yttrium, etc). Moreover, YBCO is popular in industry because its superconducting transition temperature of about 87 Kelvin allows liquid nitrogen to be used as a coolant.

It is to be understood that particulate materials can be added to the thick film to enhance flux pinning properties. The particulate materials may comprise barium zirconate, yttrium barium zirconate, yttrium oxide, etc. Moreover, the particulate materials can range in size from about 5 nanometers to about 100 nanometers in major dimensions and are present in amounts ranging from about 1 weight percent to about 20 weight percent.

It is to be understood that one or more structural layers can be placed between the cubic metal oxide material and the thick film. The structural layers may comprise $SrRuO_3$, $SrTiO_3$, or mixtures of $SrRuO_3$ and $SrTiO_3$, cerium oxide, yttrium oxide, etc. The article's ultimate application determines whether the one or more structural layers are preferred.

To construct both the composite structure and the article, the cubic metal oxide material and the thick film must be suitably deposited. Both materials can be deposited by pulsed laser deposition ("PLD"), metalorganic chemical vapor deposition ("MOCVD"), evaporation (e.g., e-beam evaporation and activated reactive evaporation), sputtering (e.g., magnetron sputtering, ion beam sputtering, and ion assisted sputtering), cathodic arc deposition, chemical vapor deposition, plasma enhanced chemical vapor deposition, atomic layer deposition, molecular beam epitaxy, sol-gel processes, liquid phase epitaxy, and the like.

The deposition technique for the thick film may depend upon the rare earth metal composition of the cubic metal oxide material. For example, if the rare earth metal composition ranges from about 6 atomic percent to about 75 atomic percent, PLD may be preferred. But, if the rare earth metal composition ranges from about 75 atomic percent to about 99 atomic percent, MOCVD may be preferred.

If the thick film is deposited by PLD, then the target material is pressed under high pressure (e.g., generally above 1000 pounds per square inch) into a pellet or disk. The pressed pellet (i.e., target material pellet) is sintered in an approximately 950° C. oxygen or oxygen-containing atmosphere for at least one hour (preferably about 12 hours to about 24 hours). A suitable PLD apparatus is shown by Muenchausen et al (*Effects of Beam Parameters on Excimer Laser Deposition of $YBa_2Cu_3O_{7-\delta}$*, Appl. Phys. Lett. 56, 578 (1990)).

Meanwhile the substrate upon which the target material is to be deposited is mounted upon a heated holder in the deposition chamber. The heated holder maintains a temperature during deposition from about 600° C. to about 950° C. (preferably from about 700° C. to about 850° C.) and rotates at about 0.5 rotations per minute (to achieve uniform deposition).

Next, the pressed pellet is placed in the deposition chamber. The laser (e.g., excimer laser (20 nanoseconds, 248 or 308 nanometers) targets the pressed pellet at an incident angle of about 45°. The distance between the material upon which the target material is to be deposited and the pressed pellet is from about 4 centimeters to about 10 centimeters. Moreover, the deposition chamber is maintained at a pressure from about 0.1 millitorr to about 10 Torr (preferably from about 100 millitorr to about 250 millitorr).

The deposition rate of the target material varies from about 0.1 angstrom per second to about 200 angstrom per second by changing the laser repetition rate from about 0.1 hertz to about 200 hertz. The laser beam dimensions are about 1 millimeter by about 4 millimeters with an average energy density from about 1 joule per square centimeter to about 4 joules per square centimeter. After the target material is deposited, it is cooled to room temperature in a high partial pressure of oxygen (greater than about 100 Torr).

If the thick film is deposited by MOCVD, then the target material is dissolved and forms a liquid precursor solution. The liquid precursor solution is pumped at a constant rate of from about 0.1 milliliters per minute to about 10 milliliters per minute into a vaporizer maintained at a steady temperature ranging from about 180° C. to about 300° C. and a steady pressure ranging from about 1 Torr to about 15 Torr. An inert gas (e.g., argon, nitrogen, etc) may be supplied to the vaporizer at a rate of from about 500 milliliters per minute to about 4000 milliliters per minute.

Meanwhile, the material upon which the target material (i.e., vaporized precursor) is to be deposited is heated to a temperature from about 750° C. to about 850° C. in the deposition chamber.

Next, the vaporized precursor exits the vaporizer, is mixed with oxygen, and is transported to a deposition chamber through small-bore tubing. The small-bore tubing is maintained at a temperature from about 230° C. to about 270° C.

In the deposition chamber, the vaporized precursor is injected uniformly over the material upon which the target material (i.e., the vaporized precursor) is to be deposited through a showerhead (e.g., disc with perforated holes that achieve uniform flow). The distance between the material upon which the target material (i.e., the vaporized precursor) is to be deposited and the showerhead is from about 15 millimeters to about 30 millimeters. Moreover, the deposition chamber is maintained at a pressure from about 1 Torr to about 2.5 Torr, however, pressures may range up to about 500 Torr. After the target material is deposited, it is cooled to room temperature in a high partial pressure of oxygen (e.g., 100 Torr to about 760 Torr). Selvamanickam et al (US 2004/0265649) and Selvamanickam et al (US 2006/0115580) discuss a MOCVD process.

The present invention is more particularly described in the following examples that are intended as illustrative only because numerous modifications and variations will be apparent to those skilled in the art.

EXAMPLE 1

A coated conductor (e.g., a composite structure coated with a HTS material) was formed with the following architecture: Hastelloy base substrate/$Al_2O_3$/$Y_2O_3$/IBAD-MgO/$Sm_{0.2}Zr_{0.8}O_{1.7}$/YBCO. The $Sm_{0.2}Zr_{0.8}O_{1.7}$ material was about 30 nanometers thick and was deposited by reactive magnetron cosputtering using two radio frequency magnetron sputter guns (one having the samarium target and one having the zirconium target). The two radio frequency magnetron sputter guns were positioned at an angle of 60° between each other, and both guns were inclined at a 45° angle towards the base substrate. During deposition, the base substrate was at 750° C. and the background oxygen pressure was $1.0 \times 10^{-2}$ Torr. The $Sm_{0.2}Zr_{0.8}O_{1.7}$ had an in-plane texture of 5.9° FWHM and an out-of-plane texture of 2.8° FWHM.

YBCO was then deposited by PLD. The YBCO had an in-plane texture of 5.0° FWHM and an out-of-plane texture of 0.9° FWHM.

The resulting coated conductor had a YBCO thickness of 1.2 micrometers, a $T_c$ of 92.0 K, and a $J_c$ of 0.9 megaamps per square centimeter. The results indicate that the samarium zirconate material provides barrier protection roughly equivalent to the bi-layer buffer comprised of homoepitaxial MgO and $SrTiO_3$.

EXAMPLE 2

A coated conductor was formed with the following architecture: Hastelloy base substrate/$Al_2O_3$/$Y_2O_3$/IBAD-MgO/$Sm_{0.3}Zr_{0.7}O_{1.5}$/YBCO. The $Sm_{0.3}Zr_{0.7}O_{1.5}$ material was about 60 nanometers thick and was deposited by reactive magnetron cosputtering using two radio frequency magnetron sputter guns (one having the samarium target and one having the zirconium target). The two radio frequency magnetron sputter guns were positioned at an angle of 60° between each other, and both guns were inclined at a 45° angle towards the base substrate. During deposition, the base substrate was at 750° C. and the background oxygen pressure was $1.0 \times 10^{-2}$ Torr. The $Sm_{0.3}Zr_{0.7}O_{1.5}$ had an in-plane texture of 4.4° FWHM and an out-of-plane texture of 2.5° FWHM.

YBCO was then deposited by PLD. The YBCO had an in-plane texture of 2.7° FWHM and an out-of-plane texture of 1.1° FWHM.

The resulting coated conductor had a YBCO thickness of 1.5 micrometers, a $T_c$ of 89.0 K, and a $J_c$ of 2.6 megaamps per square centimeter. The results indicate that the functionality of samarium zirconate material as buffer is roughly equivalent to the bi-layer buffer comprised of homoepitaxial MgO and $SrTiO_3$.

EXAMPLE 3

Numerous coated conductors were formed with the following architecture: Hastelloy base substrate/$Al_2O_3$/$Y_2O_3$/IBAD-MgO/$Sm_XZr_{1-X}O_Y$/YBCO. The $Sm_XZr_{1-X}O_Y$ material was about 60 nanometers thick and was deposited by reactive magnetron cosputtering using two radio frequency magnetron sputter guns (one having the samarium target and one having the zirconium target). The two radio frequency magnetron sputter guns were positioned at an angle of 60° between each other, and both guns were inclined at a 45° angle towards the base substrate. The samarium atomic fraction (i.e., X) was varied from 0.06 to 0.75 by changing the power on the radio frequency magnetron sputter guns. During deposition, the base substrate was at 750° C. and the background oxygen pressure was $1.0 \times 10^{-2}$ Torr. The $Sm_XZr_{1-X}O_Y$ had an in-plane texture of around 7.0° FWHM (FIG. 1).

YBCO was then deposited by PLD. The YBCO had an in-plane texture ranging from 2.7° to 5.0° FWHM (FIG. 1).

Figure 2:
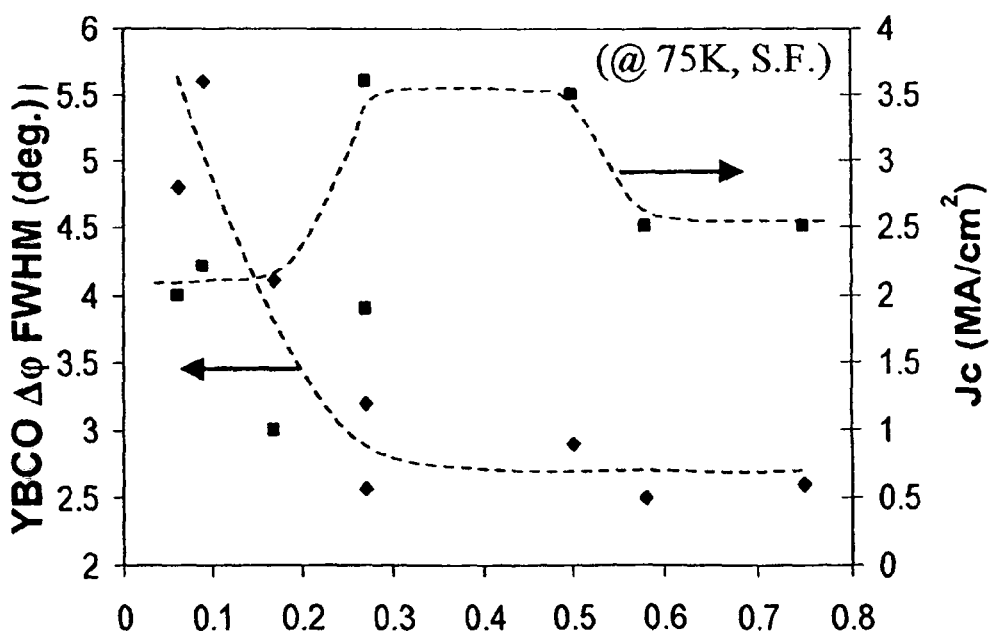
FIG. 2 shows critical current density ($J_c$) values of YBCO plotted versus samarium content in a samarium zirconate layer.

The resulting coated conductors had a YBCO thickness of about 1.0 micrometers and a $J_c$ ranging from about 2.0 to 3.6 megaamps per square centimeter (FIG. 2). The results indicate that the functionality of samarium zirconate material as buffer is roughly equivalent to the bi-layer buffer comprised of homoepitaxial MgO and $SrTiO_3$.

EXAMPLE 4

A composite structure was formed with the following architecture:

Hastelloy base substrate/$Al_2O_3$/$Y_2O_3$/IBAD-MgO/$Sm_XZr_{1-X}O_Y$. The $Sm_XZr_{1-X}O_Y$ material was deposited by reactive magnetron cosputtering using two radio frequency magnetron sputter guns (one having the samarium target and one having the zirconium target). The two radio frequency magnetron sputter guns were positioned at an angle of 60° between each other, and both guns were inclined at a 45° angle towards the base substrate. During deposition, the base substrate was at 780° C. and the background oxygen pressure was about 5.0 millitorr. The $Sm_XZr_{1-X}O_Y$ was grown at a rate of about 4.0 to about 5.6 nanometers per minute.

Figure 3:
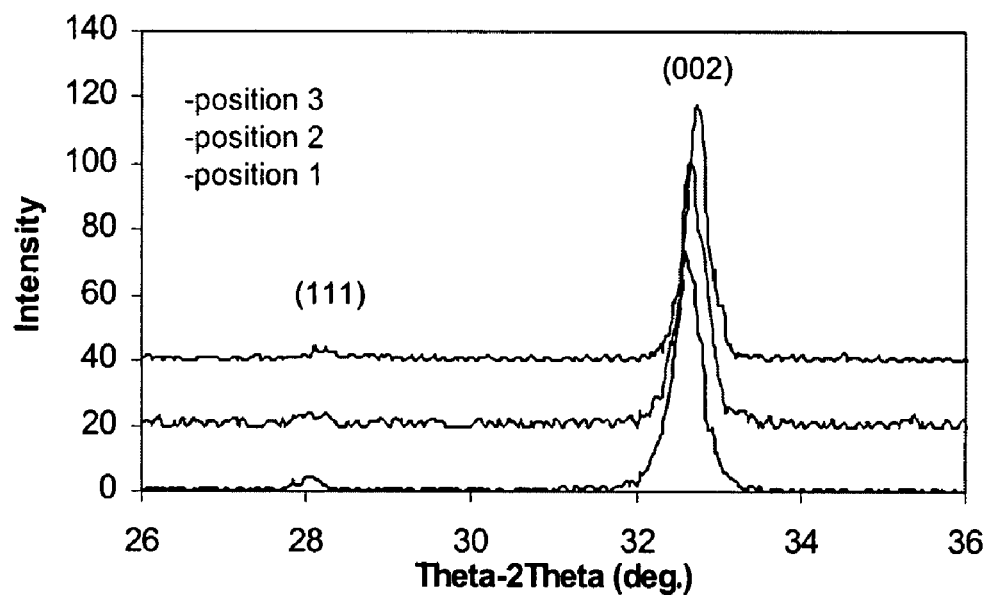
FIG. 3 shows the x-ray diffraction ("XRD") Θ-2Θ scans for samarium zirconate films with samarium compositions from 70 atomic percent to 78 atomic percent.

XRD determined the orientation and texture of the $Sm_XZr_{1-X}O_Y$. The 5 centimeter long sample was examined at the middle and both ends. The Θ-2Θ scans (FIG. 3) indicate that the $Sm_XZr_{1-X}O_Y$ material is preferentially (~98%) (001) out-of-plane oriented (although a very weak (111) refraction pattern was observed). The shift of the (002) peaks with different compositions indicates the change of lattice constants of the materials. Rutherford backscattering spectroscopy ("RBS") confirmed the samarium atomic fraction varied from about 0.70 (at the end closer to the zirconium sputter gun) to about 0.78 (at the end closer to the samarium sputter gun).

The out-of-plane texture was determined from the rocking curve of the (002) samarium zirconate. The in-plane texture was determined from the φ scan of (111) samarium zirconate. TABLE 1 shows the Ω FWHM and φ FWHM values.

TABLE 1

| Position | Composition | Ω FWHM | Φ FWHM |
|---|---|---|---|
| 1 | 78 atomic percent Sm<br>22 atomic percent Zr | 5° | 6.6° |
| 2 | 74 atomic percent Sm<br>26 atomic percent Zr | 4.8° | 6.3° |
| 3 | 70 atomic percent Sm<br>30 atomic percent Zr | 5° | 6.2° |

EXAMPLE 5

(Gd,Y)BCO was then deposited by MOCVD on the composite structure of EXAMPLE 4. The resulting coated conductor had a (Gd,Y)BCO thickness of about 0.9 micrometers.

Figure 4:
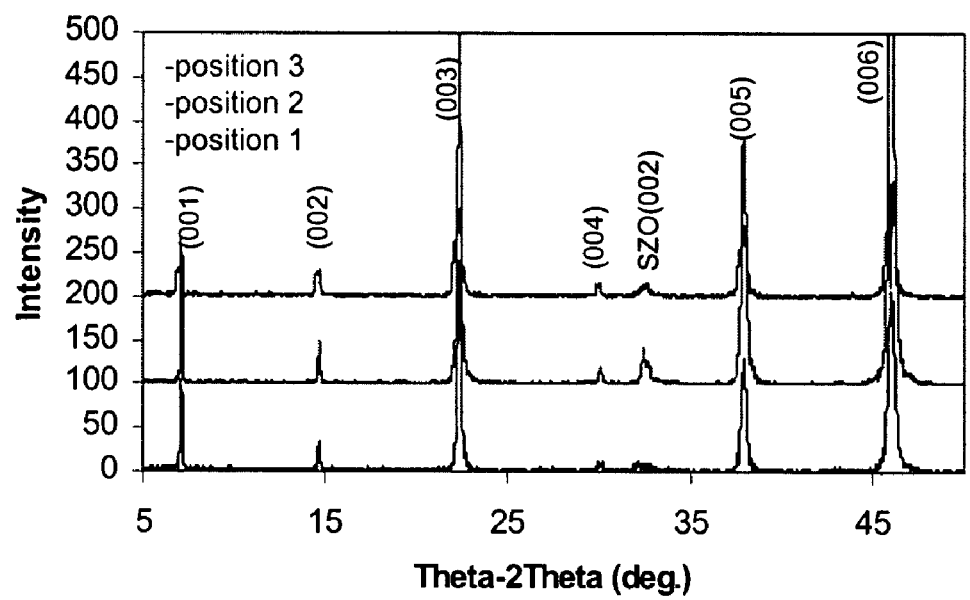
FIG. 4 shows the XRD Θ-2Θ scans for (gadolinium, yttrium)BCO films grown by MOCVD process on samarium zirconate buffer layers with samarium compositions from 70 atomic percent to 78 atomic percent.

XRD Θ-2Θ scan (FIG. 4) indicates the (Gd,Y)BCO was c-axis oriented. The out-of-plane texture was determined by the FWHM of the rocking curve of the (005) (Gd,Y)BCO. The in-plane texture was determined by the FWHM of the φ scan of (103) (Gd,Y)BCO reflections. TABLE 2 (below) shows the Ω FWHM and φ FWHM values.

The superconducting properties of the (Gd,Y)BCO films were characterized by measuring the $T_c$ and $J_c$ at liquid-nitrogen temperature (75.5 Kelvin) in self-field. Microbridges were patterned on the (Gd,Y)BCO films and a standard four-probe method using the 1 microvolt per centimeter voltage criterion was used to measure the $J_c$. TABLE 2 shows the $T_c$ and $J_c$ values.

TABLE 2

| Position | Composition | Ω FWHM | Φ FWHM | $T_c$ (K) | $J_c$ (MA/cm²) |
|---|---|---|---|---|---|
| 1 | 78 atomic percent Sm<br>22 atomic percent Zr | 2.4° | 4.5° to 5.3° | 91.3 | 2.17 |
| 2 | 74 atomic percent Sm<br>26 atomic percent Zr | 1.9° | 3.4° to 4.2° | 91.3 | 1.97 |
| 3 | 70 atomic percent Sm<br>30 atomic percent Zr | 1.8° | 3.3° to 4.1° | 91.3 | 2.25 |

EXAMPLE 6

A composite structure was formed with the following architecture: Hastelloy C-276 base substrate/$Al_2O_3$ diffusion barrier layer (~60 nanometers)/$Y_2O_3$ nucleation layer (~7 nanometers)/IBAD MgO layer (~10 nanometers)/$Sm_XZr_{1-X}O_Y$. The $Sm_XZr_{1-X}O_Y$ material was deposited by reactive magnetron cosputtering using two radio frequency magnetron sputter guns (one having the samarium target and one having the zirconium target). The two radio frequency magnetron sputter guns were positioned at an angle of 60° between each other, and both guns were inclined at a 45° angle towards the base substrate. The base substrate was placed at a 9 centimeter distance (measured on the vertical direction) from the center of the radio frequency sputter guns. During deposition, the base substrate was at 780° C. and the background oxygen pressure was about 5 millitorr. The $Sm_XZr_{1-X}O_Y$ was grown at a rate of about 5 nanometers per minute. To achieve a samarium zirconate with a higher samarium content, the power of the samarium sputter gun was increased and the power of the zirconium sputter gun was decreased.

Figure 5:
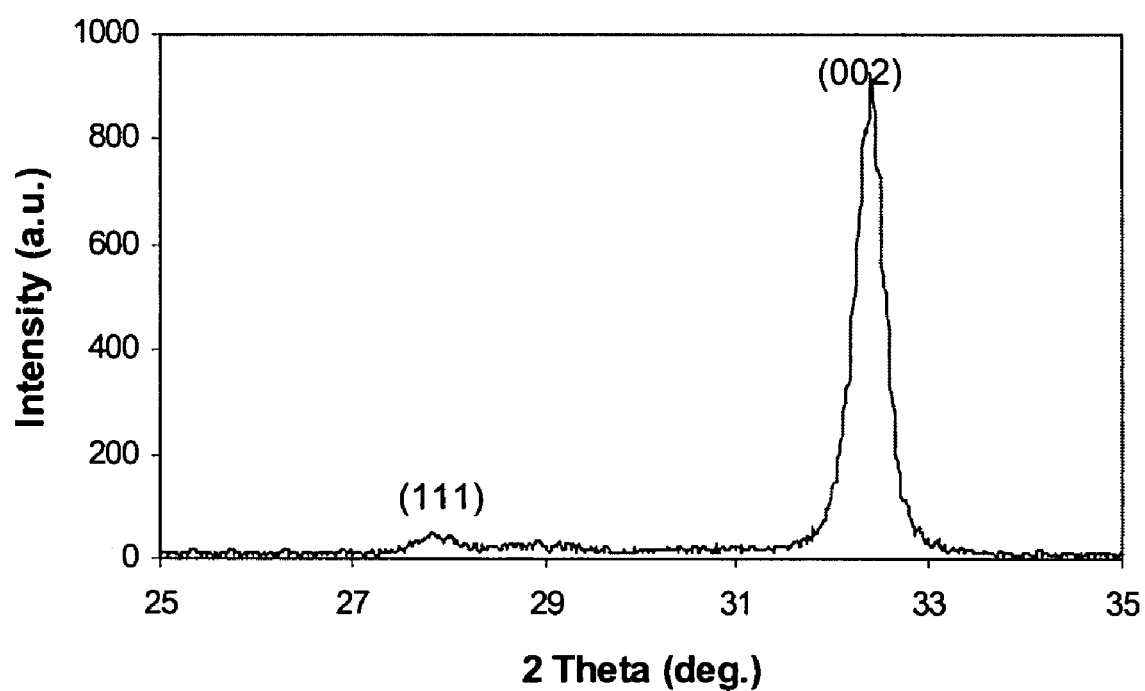
FIG. 5 shows the Θ-2Θ scan of the samarium zirconate (with 83 atomic percent samarium) film deposited on IBAD MgO.
Figure 6:
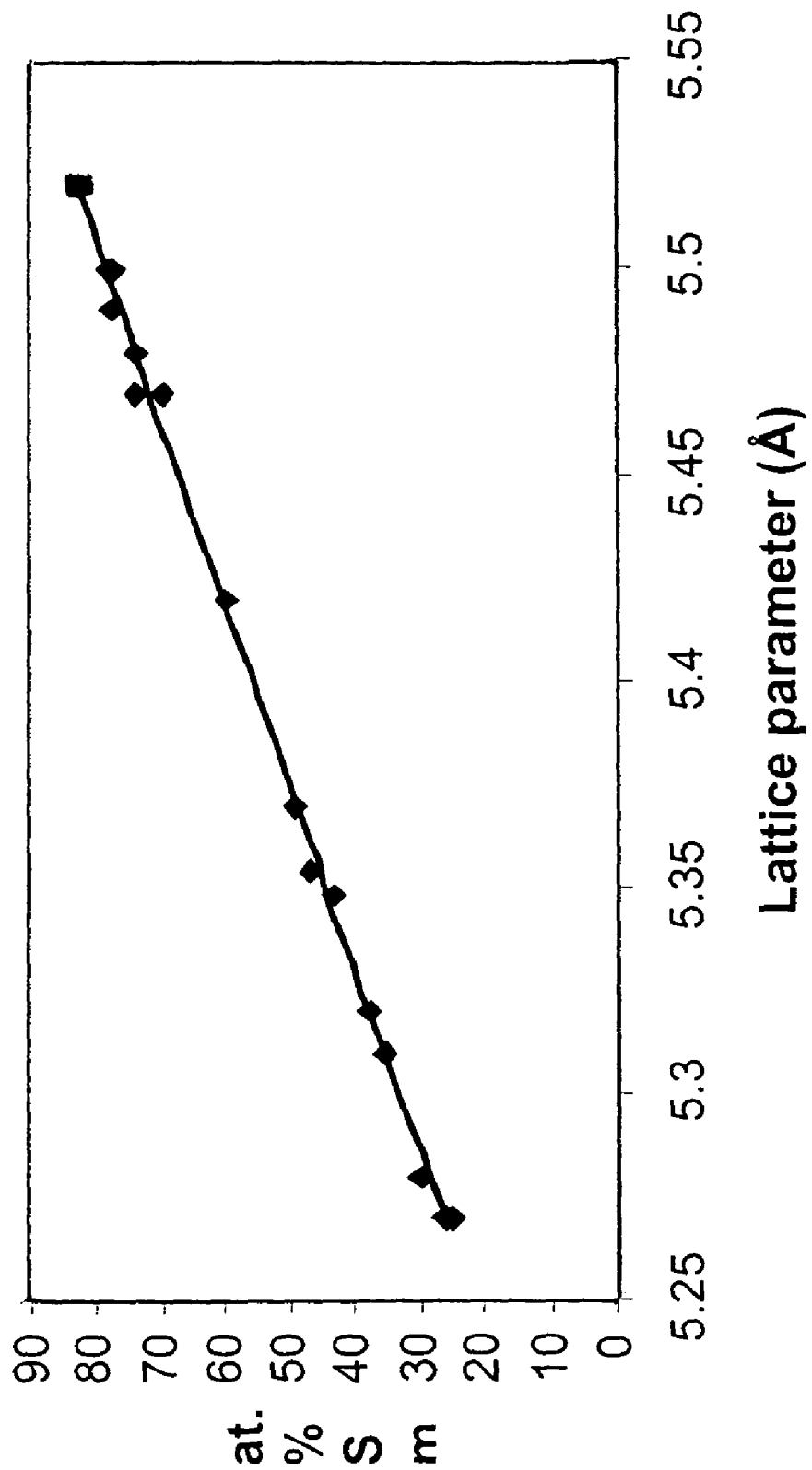
FIG. 6 shows samarium atomic percentage in the samarium zirconate as a function of lattice parameter of the samarium zirconate films.

XRD determined the orientation and texture of the $Sm_XZr_{1-X}O_Y$. The Θ-2Θ scan (FIG. 5) indicate that the $Sm_XZr_{1-X}O_Y$ material is preferentially (~98%) (001) out-of-plane oriented (although a very weak (111) refraction peak was observed). The lattice parameter of samarium zirconate was about 5.52 angstroms as calculated by the position of the (002) peak at 32.4°. The samarium content in the samarium zirconate was estimated by extrapolating the lattice parameter for the samarium zirconate film using a plot of samarium atomic percent as a function of lattice parameter (FIG. 6). The data points are compositions determined by RBS.

The out-of-plane texture of 5° FWHM was determined from the rocking curve of the (002) samarium zirconate. The in-plane texture of 6.4° FWHM was determined from the φ scan of (111) samarium zirconate reflection.

EXAMPLE 7

A composite structure was formed with the following architecture: electrochemically polished Hastelloy C-276 base substrate/$Al_2O_3$ diffusion barrier layer (~60 nanometers)/$Y_2O_3$ nucleation layer (~7 nanometers)/IBAD MgO layer (~10 nanometers)/$Sm_2O_3$. The $Sm_2O_3$ material was deposited by reactive radio frequency magnetron sputtering using a sputter gun inclined toward the substrate at a 45° angle. The base substrate was placed at a 9 centimeters distance (measured on the vertical direction) from the center of the gun. During deposition, the base substrate temperature was 765° C. and the background oxygen pressure was about 5 millitorr.

Figure 7:
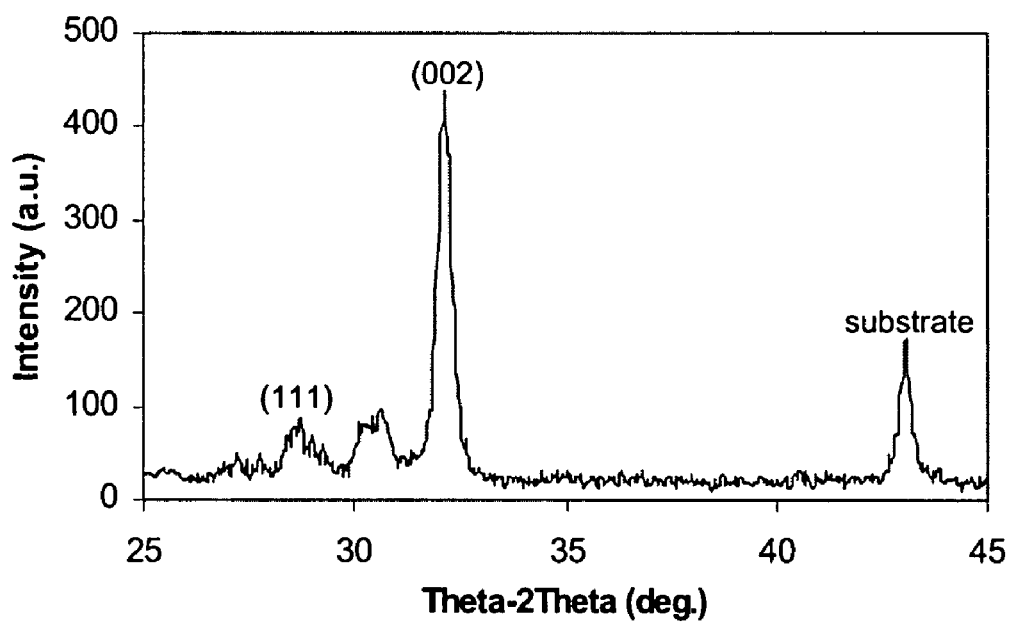
FIG. 7 shows the Θ-2Θ scan of the samarium (III) oxide ("$Sm_2O_3$") film deposited on IBAD MgO.

XRD determined the orientation and texture of the $Sm_2O_3$. The Θ-2Θ scan (FIG. 7) indicates that the $Sm_2O_3$ film grown on IBAD MgO is preferentially (001) out-of-plane oriented.

The out-of-plane texture of 5.2° FWHM was determined from the rocking curve of the (002) $Sm_2O_3$. The in-plane texture of 6.50° FWHM was determined from the φ scan of (111) $Sm_2O_3$.

EXAMPLE 8

YBCO was then deposited by PLD on the composite structures of EXAMPLES 6 and 7. The resulting coated conductor had a YBCO thickness of about 0.83 micrometers.

Figure 8:
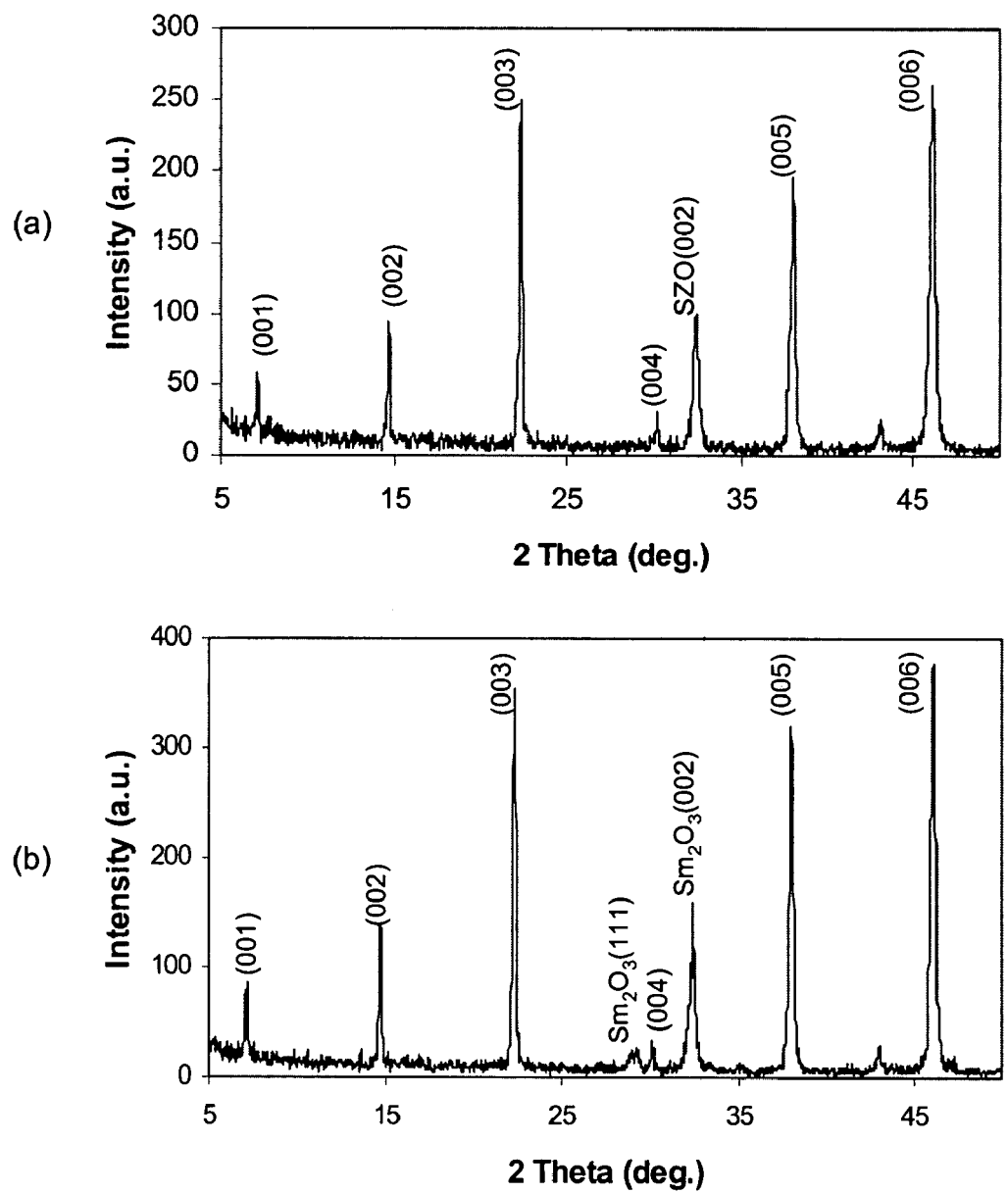
FIG. 8 shows the Θ-2Θ scans of the YBCO films grown by PLD process on the (a) samarium zirconate and (b) $Sm_2O_3$.

XRD Θ-2Θ scans (FIGS. 8(a) and 8(b)) indicate the YBCO was c-axis oriented on both the samarium zirconate and $Sm_2O_3$ substrates. The φ scans around the [103] YBCO and the rocking curve of (005) YBCO for YBCO/samarium zirconate and YBCO/$Sm_2O_3$ are shown in FIGS. 9(a) and 9(b), respectively. The in-plane texture was determined by the FWHM of the φ scan of (103) YBCO reflections. The out-of-plane texture was determined by the FWHM of the rocking curve of the (005) YBCO. TABLE 3 (below) shows the Ω FWHM and φ FWHM values.

The superconducting properties of the YBCO films were characterized by measuring the $T_c$ and $J_c$ at liquid-nitrogen temperature (75.5 Kelvin) in self-field. The $T_c$ for YBCO/$Sm_2O_3$ was below 85 Kelvin, indicating that the $Sm_2O_3$ does not function well as a buffer under the existing conditions. Thus, only the YBCO/samarium zirconate was patterned with a 5 millimeter by 270 micrometer microbridge to measure the $J_c$. A standard four-probe method using the 1 microvolt per centimeter voltage criterion was used to measure the $J_c$. TABLE 3 shows the $T_c$ and $J_c$ values.

TABLE 3

| Sample | Composition | Ω FWHM | Φ FWHM | $T_c$ (K) | $J_c$ (MA/cm²) |
|---|---|---|---|---|---|
| YBCO/SZO | 83 atomic percent Sm 17 atomic percent Zr | 1.6° | 3.1° to 4.7° | 91.3 | 2.17 |
| YBCO/$Sm_2O_3$ | 100 atomic percent Sm | 2.8° | 3.9° to 5.9° | <86 | NA |

Accordingly, it can be seen that the invention provides a composite structure suitable for subsequent deposition of a thick film. In addition, the invention also provides for an article comprising a composite structure and a thick film upon the composite structure. In addition, the invention also provides for a superconducting article comprising a composite structure coated with an yttrium barium copper oxide material. Although the description contains many details, these should not be construed as limiting the scope of the invention but as merely providing illustrations of some embodiments. Therefore, it will be appreciated that the scope of the present invention fully encompasses other embodiments which may become obvious to those skilled in the art, and that the scope of the present invention is accordingly to be limited by nothing other than the appended claims. All structural, chemical, and functional equivalents to the materials of the above-described embodiments that are known to those of ordinary skill in the art are expressly incorporated herein by reference and are intended to encompass the present claims. Moreover, it is not necessary for an article, method, or process to address each and every problem sought to be solved by the present invention for it to be encompassed by the present claims.

All publications, patents, and patent applications cited in this specification are herein incorporated by reference as if each individual publication or patent application were specifically and individually indicated to be incorporated by reference.

We claim:

1. A superconducting article comprising:
    a base substrate,
    an IBAD oriented material upon said base substrate,
    a cubic metal oxide material of $Sm_XZr_{1-X}O_Y$ where X ranges from about 0.06 to about 0.99 upon said IBAD oriented material, and
    an yttrium barium copper oxide material upon said cubic metal oxide material.

2. A composite structure suitable for subsequent deposition of a thick film comprising:
    a base substrate,
    an IBAD oriented material upon said base substrate, and
    a cubic metal oxide material of $Sm_XZr_{1-X}O_Y$ where X ranges from about 0.06 to about 0.99 upon said IBAD oriented material.

3. The composite structure of claim 2 wherein said cubic metal oxide material has a rare earth metal content ranging from about 25 atomic percent to about 97 atomic percent.

4. The composite structure of claim 2 wherein said cubic metal oxide material is deposited by sputtering.

5. The composite structure of claim 2 wherein said base substrate is selected from polycrystalline metal, polycrystalline ceramic, single crystal, silica, metallic glass, or glass.

6. The composite structure of claim 2 wherein said IBAD oriented material is magnesium oxide.

7. An article comprising
a base substrate,
an IBAD oriented material upon said base substrate,
a cubic metal oxide material of $Sm_X Zr_{1-X} O_Y$ where X ranges from about 0.06 to about 0.99 upon said IBAD oriented material, and
a thick film upon said cubic metal oxide material.

8. The article of claim 7 wherein said thick film is selected from the group consisting of superconductor materials, semiconductor materials, photovoltaic materials, magnetic materials, ferroelectric materials, ferromagnetic materials, piezolelectirc materials, insulating materials, conductive materials, and precursor materials for superconductors.

9. The article of claim 7 wherein said thick film is a superconducting material.

10. The article of claim 7 wherein said thick film comprises yttrium barium copper oxide.

11. The article of claim 7 wherein said cubic metal oxide material has a rare earth metal content ranging from about 25 atomic percent to about 97 atomic percent.

12. The article of claim 7 wherein said cubic metal oxide material is deposited by sputtering.

13. The article of claim 7 wherein said thick film is deposited by pulsed laser deposition.

14. The article of claim 7 wherein said base substrate is selected from polycrystalline metal, polycrystalline ceramic, single crystal, silica, metallic glass, or glass.

* * * * *